United States Patent [19]

Wu

[11] Patent Number: 5,750,431
[45] Date of Patent: May 12, 1998

[54] METHOD FOR FABRICATING A STACKED CAPACITOR

[75] Inventor: Shye-Lin Wu, Hsinchu Hsien, Taiwan

[73] Assignee: Powerchip Semiconductor Corp., Hsin-Chu, China

[21] Appl. No.: 881,774

[22] Filed: Jun. 24, 1997

[51] Int. Cl.[6] .................................. H01L 21/20
[52] U.S. Cl. ...................... 438/396; 438/397; 438/253; 438/254; 148/DIG. 14
[58] Field of Search .................... 438/239, 253, 438/254, 255, 256, 396, 397, 398, 399; 148/DIG. 14

[56] References Cited

U.S. PATENT DOCUMENTS

| | | | |
|---|---|---|---|
| 5,432,116 | 7/1995 | Keum et al. | 438/397 |
| 5,543,346 | 8/1996 | Keum et al. | 438/397 |
| 5,550,076 | 8/1996 | Chen | 438/396 |
| 5,665,626 | 9/1997 | Cronin | 438/396 |

*Primary Examiner*—Tuan H. Nguyen
*Attorney, Agent, or Firm*—Ladas & Parry

[57] ABSTRACT

A method for fabricating a stacked capacitor is disclosed. The method includes forming successively a first dielectric layer, a first polysilicon layer and an insulation layer over a semiconductor substrate. The three layers are patterned to have a window in which a portion of the substrate is exposed. A second polysilicon layer is deposited over the insulation layer and filled in the window. The second polysilicon layer and the insulation layer are patterned to form an island. A dielectric spacer around the island is formed. Moreover, the second polysilicon layer over the insulation layer and the first polysilicon uncovered by the island are removed. The insulation layer in the island is then removed to leave a polysilicon rod surrounded by the dielectric spacer. Polysilicon spacers around the polysilicon rod and the dielectric spacer are formed and the dielectric spacer is removed, thereby forming a lower electrode. Finally, a second dielectric layer and an upper electrode are formed over the lower electrode.

13 Claims, 7 Drawing Sheets

METHOD FOR FABRICATING A STACKED CAPACITOR

BACKGROUND OF THE INVENTION

1. Field of the Invention

The present invention relates to a method for fabricating a semiconductor integrated circuit, and more specifically, to a method for fabricating a highly-integrated stacked capacitor for use in the memory cells of high density Dynamic Random Access Memory (DRAM).

2. Description of Related Art

As a memory device, a DRAM cell includes a transistor and a capacitor for storing a 1-bit data. Since the DRAM cell stores the data by means of the capacitor, the dimensions of the capacitor can be expanded to improve the performance of memory cells of the DRAM. However, the expansion of the capacitor's dimensions reduces the density of the DRAM device. A highly integrated capacitor structure is therefore quite desirable. In the past, a stacked capacitor has been generally utilized as a DRAM capacitor.

FIG. 1A through FIG. 1C illustrate the fabrication steps of a conventional stacked DRAM capacitor. Referring to FIG. 1A, a transistor including a gate oxide layer 14, a gate electrode 16 and diffusion regions 18 and 20 are first formed over a silicon substrate 10. The transistor is isolated from other devices by a field oxide layer 12. In order to fabricate a capacitor, an insulation layer 22 is formed over the transistor and the field oxide 12 and is patterned to define a window 23 over the diffusion region 18. Thus, a portion of the diffusion region 18 is exposed in the window 23.

Referring to FIG. 1B, a conducting polysilicon layer 24 is deposited and patterned on the structure of FIG. 1A so that it overlays the window 23, thereby covering the exposed surface of the substrate 10 and electrically conducting contact with the diffusion region 18. The polysilicon layer 24 is defined as a lower electrode of the DRAM capacitor which is being formed.

Further referring to FIG. 1C, a dielectric layer 26 and another conducting polysilicon layer 28 are successively formed over the polysilicon layer 24. The polysilicon layers 24 and 28 provide the lower electrode and upper electrode of the DRAM capacitor and thus a complete stacked capacitor is formed by this technique.

The lower electrode of the stacked capacitor of FIG. 1C extends over the dielectric layer 22 to have a large surface area. However, as the density of the DRAMs increases, the free spaces between each transistor must be minimized. This increase in density, in turn, requires that the extension of the lower electrode over the dielectric layer is limited, reducing the capacitance of the DRAM capacitor. As such, the capacitor's performance will be adversely affected as the density of the DRAMs increases.

SUMMARY OF THE INVENTION

Accordingly, the invention provides a method for fabricating a three-dimensional highly-integrated stacked capacitor which can be used advantageously with high density DRAMs.

The invention provides a method for fabricating a capacitor on a semiconductor substrate. The method of the invention includes the steps of forming a first dielectric layer over the semiconductor substrate; forming a first polysilicon layer over the first dielectric layer; forming an insulation layer over the polysilicon layer; forming a window through the insulation layer, the first polysilicon layer and the dielectric layer to expose a portion of the substrate; forming a second polysilicon layer over the insulation layer and filling in the window to come into contact with the semiconductor substrate; patterning the second polysilicon layer and the insulation layer to form an island which includes the polysilicon filled in the window region; forming a dielectric spacer around the island; removing the second polysilicon layer over the insulation layer and the first polysilicon uncovered by the island; removing the insulation layer in the island, thereby leaving a polysilicon rod surrounded by the dielectric spacer; forming polysilicon spacers around the polysilicon rod and the dielectric spacer; removing the dielectric spacer, thereby forming a lower electrode including the polysilicon rod, the polysilicon spacers and a portion of the first polysilicon layer; forming a second dielectric layer over the exposed surface of the lower electrode; and forming an upper electrode over the second dielectric layer.

DETAILED DESCRIPTION OF THE INVENTION

Figure 1A:
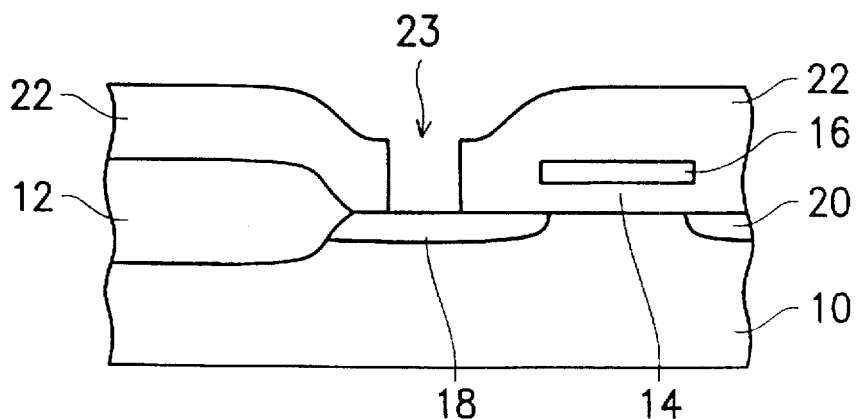
FIG. 1A through FIG. 1C are cross-sectional views illustrating the fabrication steps of a conventional stacked capacitor.
Figure 1B:
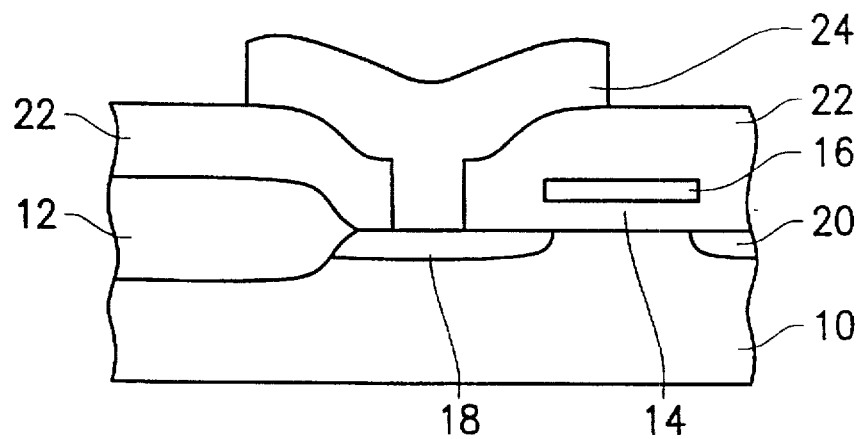
Figure 1C:
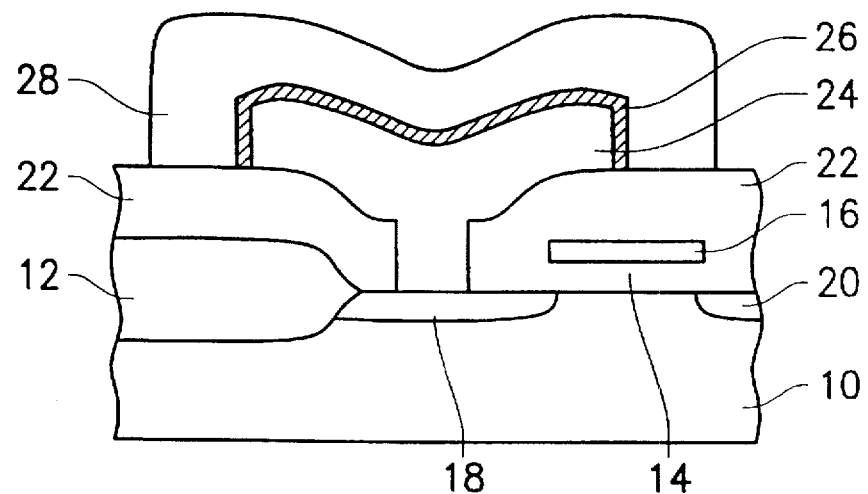
Figure 2A:
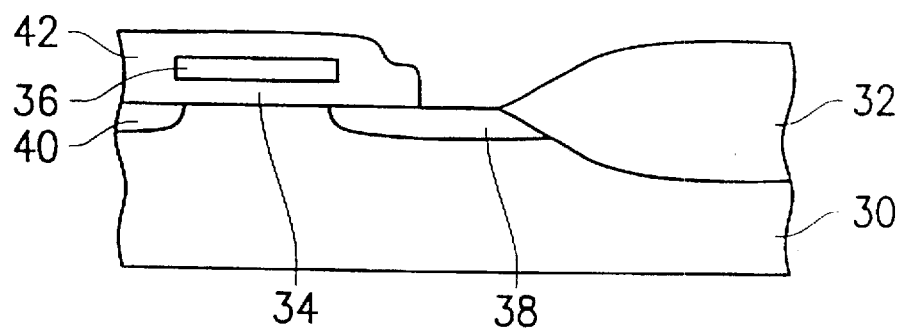
FIG. 2A through FIG. 2L are cross-sectional views illustrating the fabrication steps of a stacked capacitor according to an embodiment of the invention.

The preferred method of making the stacked capacitor of the present invention will now be described with reference to the accompanying drawings. Referring first to FIG. 2A, the capacitor to be fabricated will be disposed over a semiconductor substrate 30 on which a conventional transistor is formed. The transistor includes a gate oxide 34, a gate electrode 36 and two diffusion regions 38 and 40 in the semiconductor substrate 30. The transistor is isolated from other devices by a field oxide layer 32, and is protected by an insulating layer 42 which covers the gate electrode 36.

Figure 2B:
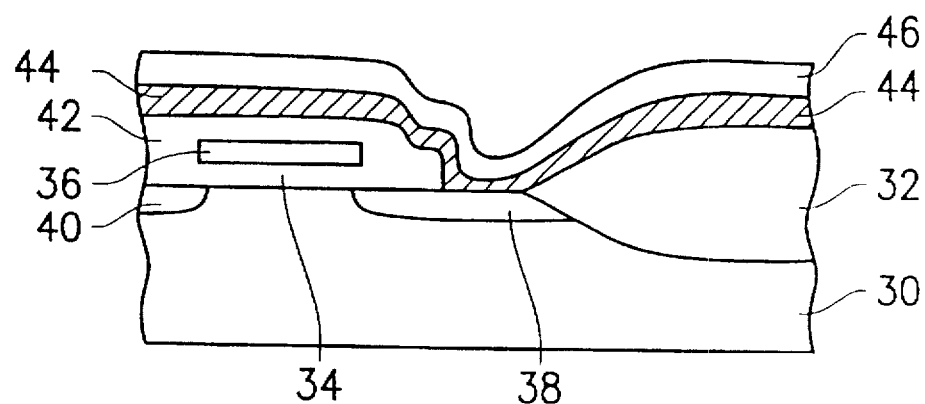

Referring to FIG. 2B, a first dielectric layer 44 and first polysilicon layer 46 are successively formed over the transistor and the semiconductor substrate 30. The first dielectric layer 44 is preferably a silicon nitride ($Si_3N_4$) layer which is deposited to a preferred thickness of 100–1000 Å. The first polysilicon layer 46 is a conducting polysilicon layer. That is, it is doped with impurities during or after its deposition over the first dielectric layer 44. The first polysilicon layer 46 is preferably deposited to a thickness of about 300–1000 Å.

Figure 2C:
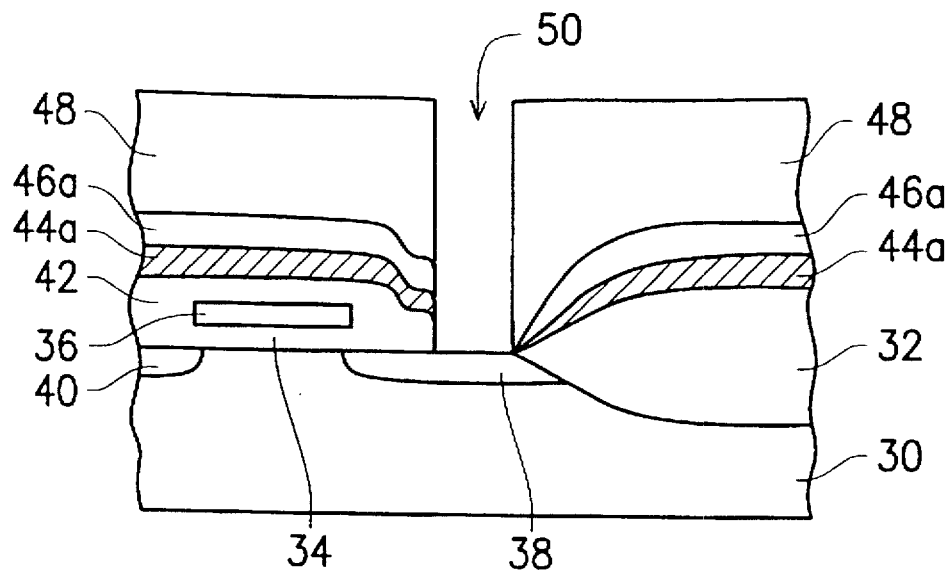

An insulation layer is then formed over the first polysilicon layer 46, and patterned to form a contact hole to the substrate. As can be seen in FIG. 2C, the contact hole 50 is formed through the insulation layer 48, the first polysilicon layer 46a and the first dielectric layer 44a, thereby exposing a portion of the diffusion region 38 in the semiconductor substrate 30. The insulation layer 48 is preferably a BPSG layer and preferably has a thickness of about 3000–10000 Å. The formation of the contact hole 50 is performed through the BPSG layer 48 using conventional dry etching techniques.

Figure 2D:
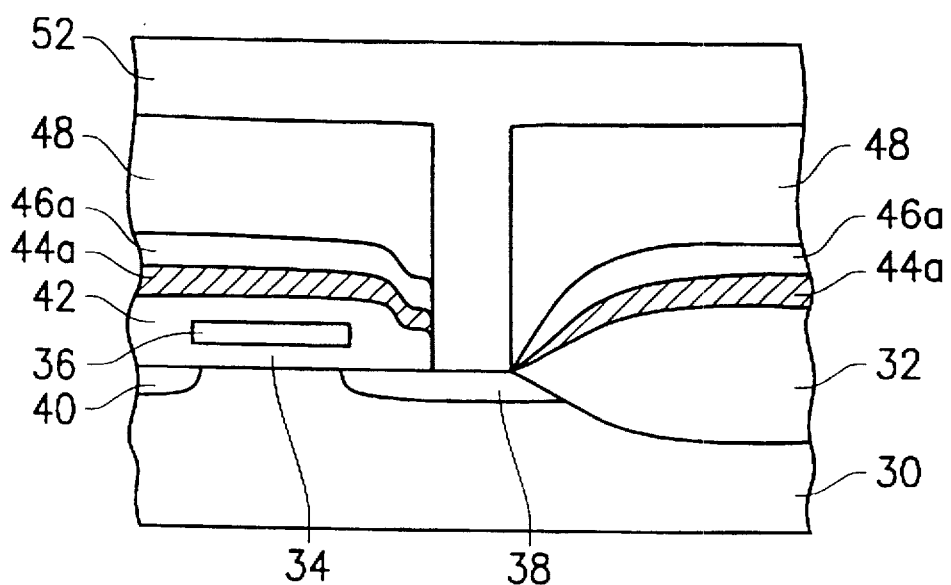

Referring to FIG. 2D, a second polysilicon layer 52 is then formed over the insulation layer 48 and fills in the contact hole 50 to make contact with the diffusion region 38 in the semiconductor substrate 30, thereby forming a polysilicon plug in the contact hole 50. The second polysilicon layer 52 is doped with impurities and preferably has a thickness of about 500–3000 Å.

Figure 2E:
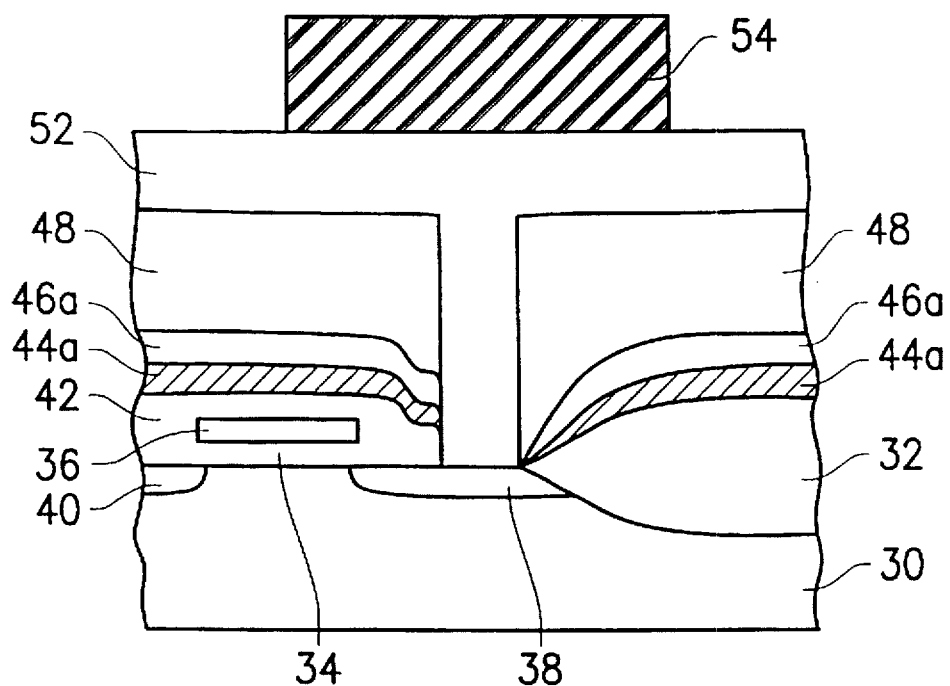
Figure 2F:
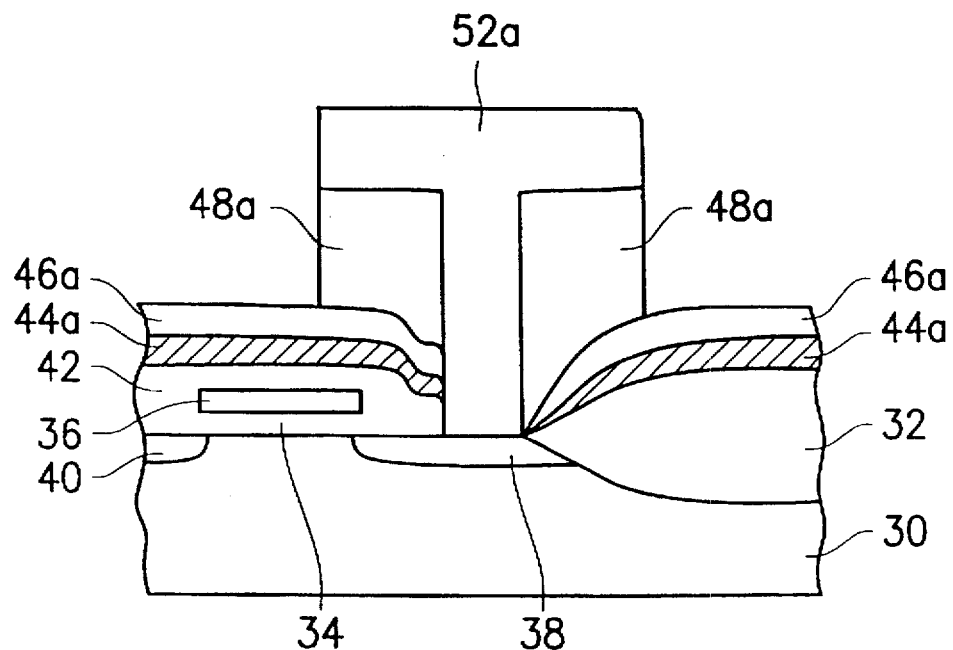

Referring now to FIG. 2E, a photoresist layer 54 is formed over the second polysilicon layer 52 to define the area or extent of the capacitor. The second polysilicon layer 52 and the insulation layer 48 are patterned to define an island. Referring to FIG. 2F, the island includes the insulation layer 48a and the second polysilicon layer 52a which includes the aforementioned polysilicon plug disposed in the contact hole 50.

Figure 2G:
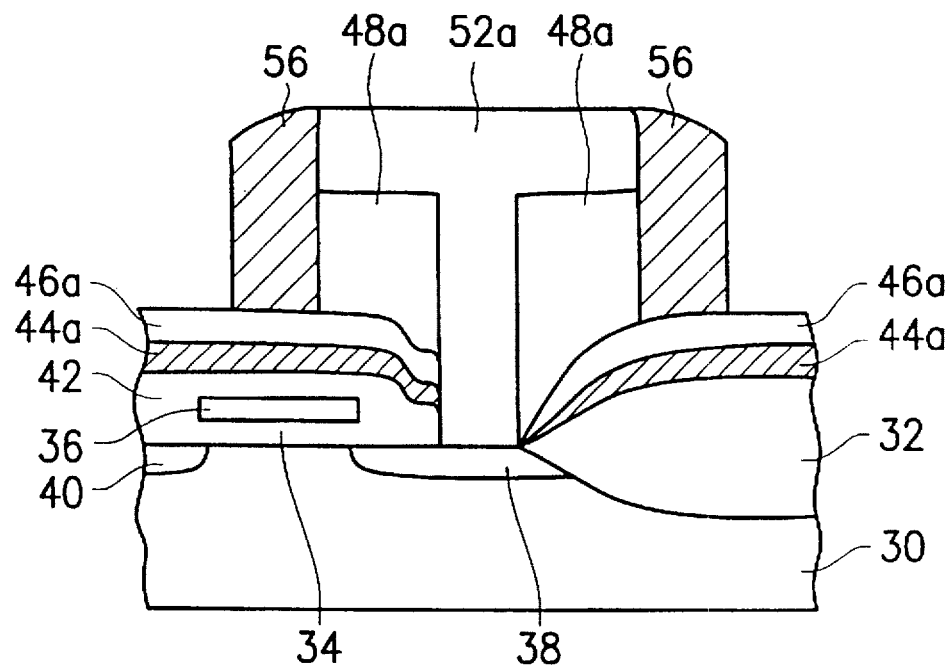

The structure of FIG. 2F is then covered with a dielectric layer by conventional CVD techniques. The dielectric layer is deposited and then etched back by dry etching techniques to form a dielectric spacer around the island. Referring to FIG. 2G, the dielectric spacer 56 can be a silicon nitride spacer which has a preferred thickness of about 300–2000 Å.

Figure 2H:
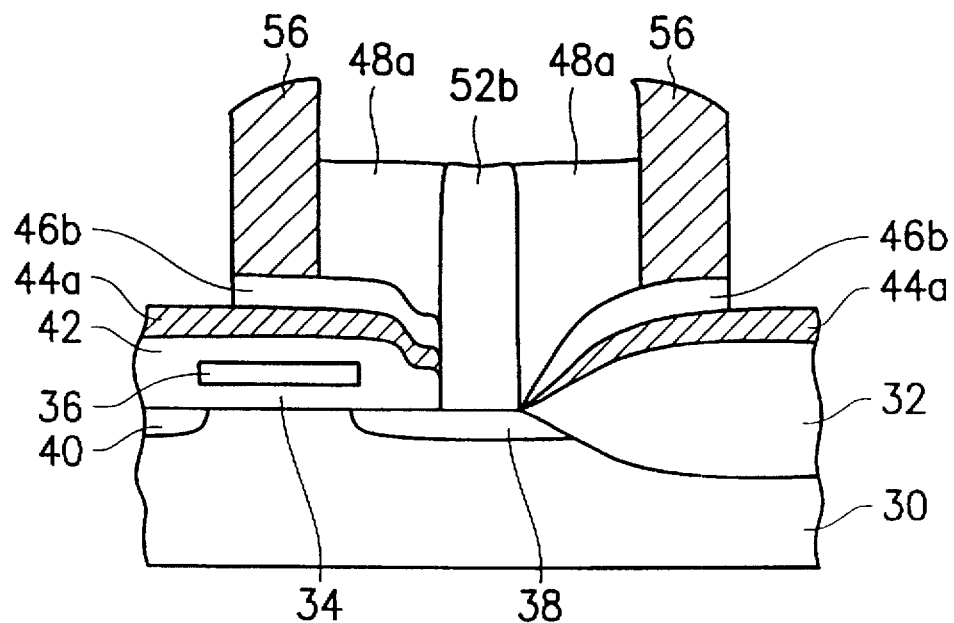

After the formation of the dielectric spacer 56, the second polysilicon layer 52a over the insulation layer 48a and the first polysilicon 46a uncovered by the island are removed by dry etching. Therefore, referring to FIG. 2H, no other polysilicon material but the polysilicon plug 52b and the polysilicon layer 46b inside the island region are left in the capacitor area.

Figure 2I:
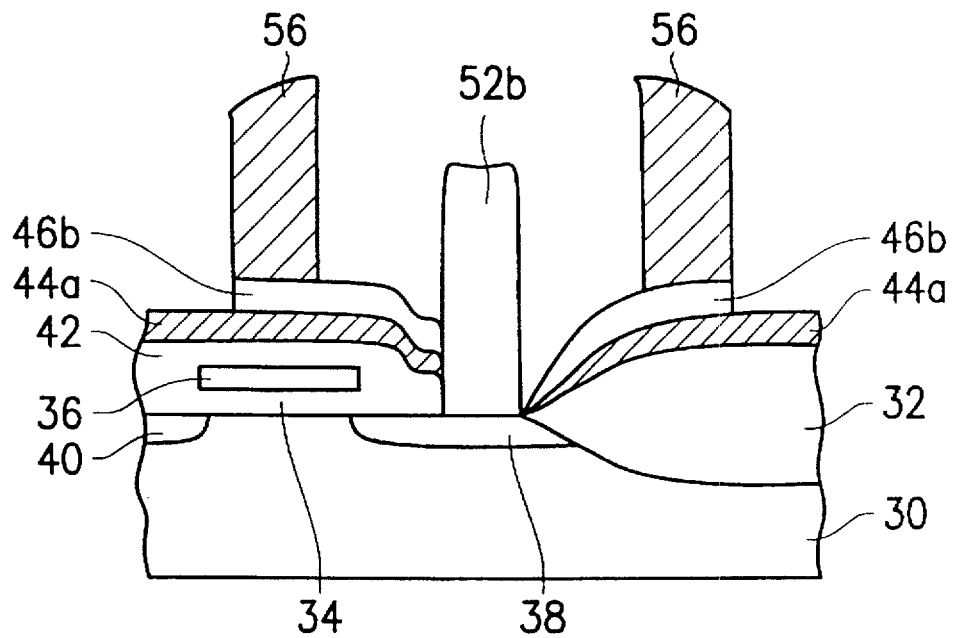
Figure 2J:
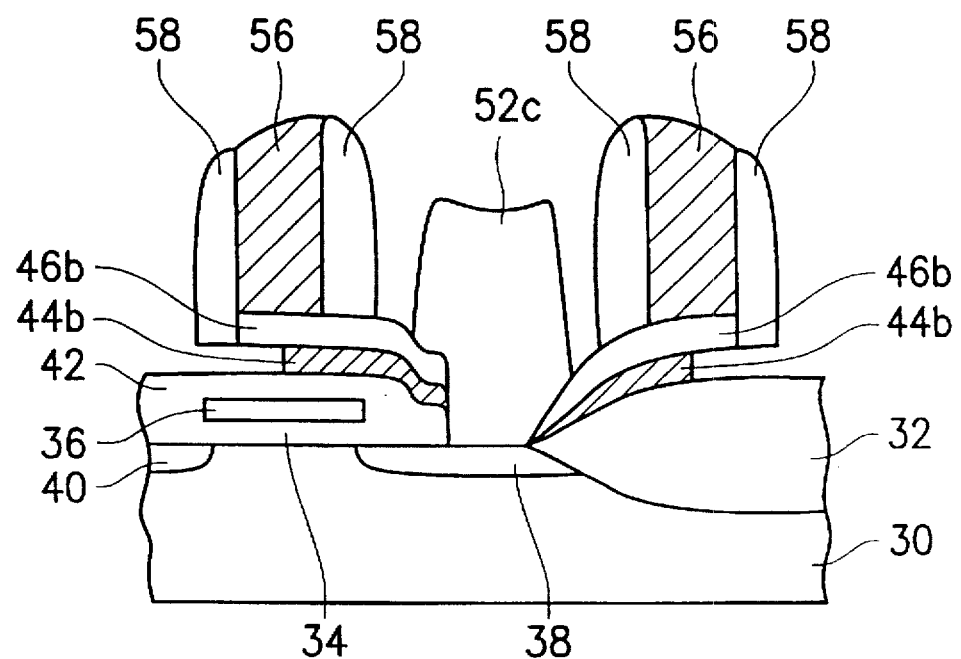

Referring to FIG. 2I, the insulation layer 48a in the island region is removed by dry etching, thereby leaving the polysilicon plug 52b which is surrounded by the dielectric spacer 56. Another conducting polysilicon layer is then deposited over the structure of FIG. 2I, by conventional CVD methods, and etched back by dry etching to form polysilicon spacers around the polysilicon plug 52b and the dielectric spacer 56. Referring to FIG. 2J, a polysilicon plug has increased in size by its spacers and thus is now referred to as plug 52c. Moreover, the polysilicon spacers 58 are formed in the capacitor area adjacent the dielectric spacer 56.

Figure 2K:
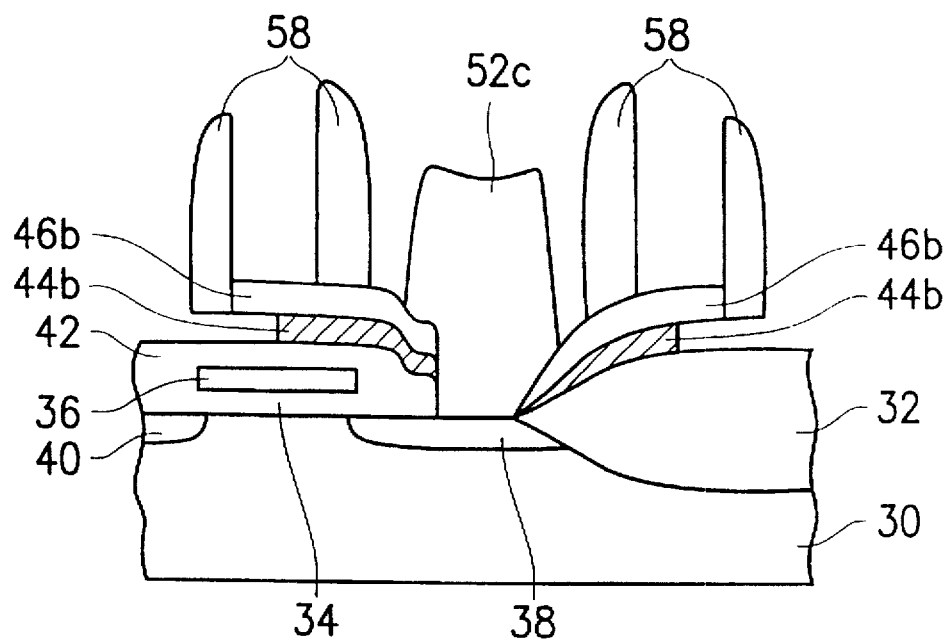

Moreover, the dielectric spacer 56 and a portion of the first dielectric layer 44a are removed. In the preferred embodiment, since the silicon nitride is utilized as dielectric material, the dielectric spacer 56 and the first dielectric layer 44a can be etched by a hot $H_3PO_4$ solution. FIG. 2K shows the results of this step: a lower electrode including the polysilicon plug 52c, the polysilicon spacers 58 and a portion of the first polysilicon layer 46b formed in the capacitor area.

Figure 2L:
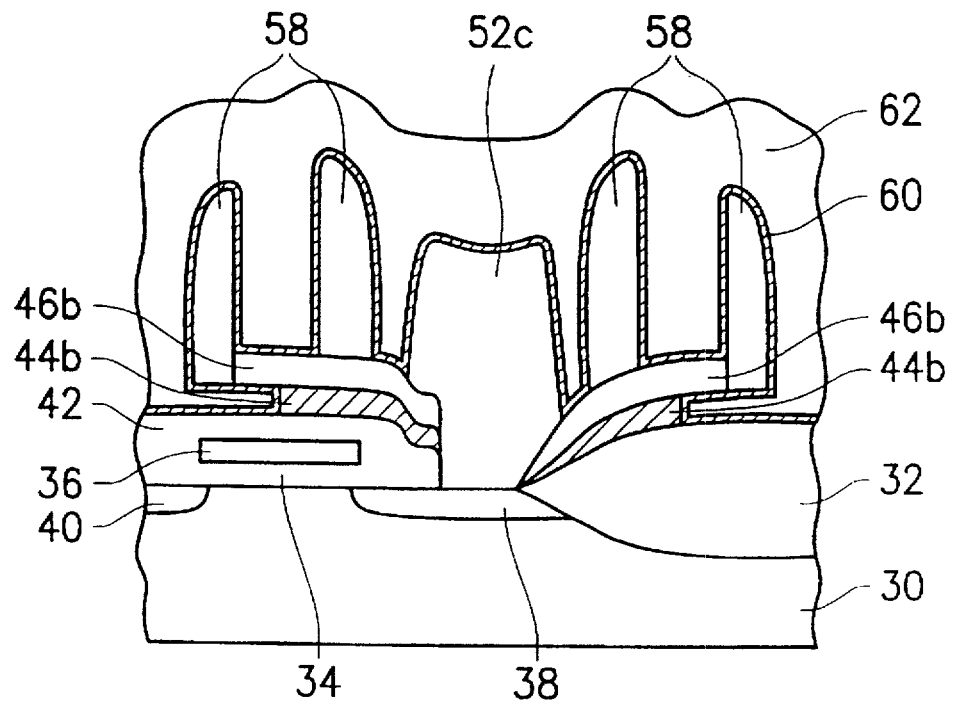

Therefore, referring now to FIG. 2L, a second dielectric layer 60 and an upper electrode 62 are successively formed over the lower electrode. The second dielectric layer 60 can be a thin ONO, $Ta_2O_5$, BST, PZT or another capacitor dielectric, while the upper electrode 62 is preferably formed by a conducting polysilicon layer. The upper electrode 62 and the second dielectric layer 60 are then patterned to confine them preferably within the capacitor area, thereby forming a complete stacked capacitor over the semiconductor substrate 30.

In the aforementioned embodiment, since the polysilicon spacers are vertically arranged over the first polysilicon layer, the surface area of the lower electrode is significantly increased. The invention therefore provides a three-dimensional highly-integrated stacked capacitor over the semiconductor substrate.

What is claimed is:

1. A method for fabricating a capacitor on a semiconductor substrate, comprising the steps of:

forming a first dielectric layer over the semiconductor substrate;

forming a first polysilicon layer over the first dielectric layer;

forming an insulation layer over the polysilicon layer;

forming a window region through the insulation layer, the first polysilicon layer and the dielectric layer to expose a portion of the substrate;

forming a second polysilicon layer over the insulation layer and filling in the window region to thereby form a polysilicon plug which makes contact with the semiconductor substrate;

patterning the second polysilicon layer and the insulation layer to form an island which includes the polysilicon plug;

forming a dielectric spacer adjacent the island;

removing the second polysilicon layer over the insulation layer and exposed portions of the first polysilicon;

removing the insulation layer in the island to thereby expose the polysilicon plug;

forming polysilicon spacers adjacent the polysilicon plug and the dielectric spacer;

removing the dielectric spacer, thereby forming a lower electrode including the polysilicon plug, the polysilicon spacers and a portion of the first polysilicon layer;

forming a second dielectric layer over the exposed surface of the lower electrode; and forming an upper electrode over the second dielectric layer.

2. The method as claimed in claim 1, wherein the first dielectric layer is formed by depositing a silicon nitride layer.

3. The method as claimed in claim 1, wherein the first polysilicon is doped with impurities when deposited over the first dielectric layer.

4. The method as claimed in claim 1, wherein the polysilicon layer is doped with impurities after deposition over the first dielectric layer.

5. The method as claimed in claim 1, wherein the insulation layer is a BPSG layer.

6. The method as claimed in claim 1, wherein the dielectric spacer is formed by etching back a dielectric layer which covers the island.

7. The method as claimed in claim 6, wherein the dielectric layer is a silicon nitride layer.

8. The method as claimed in claim 1, wherein the second dielectric layer is an ONO layer.

9. The method as claimed in claim 1, wherein the second dielectric layer is a $Ta_2O_5$ layer.

10. The method as claimed in claim 1, wherein the second dielectric layer is a BST layer.

11. The method as claimed in claim 1, wherein the second dielectric layer is a PZT layer.

12. The method as claimed in claim 1, wherein the upper electrode is formed by depositing a conducting polysilicon layer.

13. The method as claimed in claim 1 further comprising the step of defining the capacitor area by patterning the upper electrode and the second dielectric layer.

* * * * *